United States Patent
Minacapelli (10) Patent No.: US 7,353,480 B1
(45) Date of Patent: Apr. 1, 2008

(54) APPARATUS, SYSTEM, AND METHOD FOR DESIGNING VIA PADS HAVING EXTENDED CONTOURS

(75) Inventor: Joseph S. Minacapelli, Sunnyvale, CA (US)

(73) Assignee: NVIDIA Corporation, Santa Clara, CA (US)

(*) Notice: Subject to any disclaimer, the term of this patent is extended or adjusted under 35 U.S.C. 154(b) by 370 days.

(21) Appl. No.: 11/007,560

(22) Filed: Dec. 7, 2004

(51) Int. Cl.
*G06F 17/50* (2006.01)
(52) U.S. Cl. .............................. 716/10; 716/11; 716/12
(58) Field of Classification Search ................... 716/1, 716/5, 10–15; 438/6, 123, 599, 512, 612
See application file for complete search history.

(56) References Cited

U.S. PATENT DOCUMENTS

| | | | |
|---|---|---|---|
| 5,798,937 A | 8/1998 | Bracha et al. | |
| 6,516,447 B2 | 2/2003 | Wadland et al. | |
| 6,548,242 B2 | 4/2003 | Horwitz et al. | |
| 6,586,682 B2 | 7/2003 | Strandberg | |
| 6,596,549 B2 | 7/2003 | Kitamura et al. | |
| 6,638,638 B2 | 10/2003 | Kim et al. | |
| 6,701,493 B2 | 3/2004 | Gasanov et al. | |
| 6,787,443 B1 | 9/2004 | Boggs et al. | |
| 6,789,247 B2 | 9/2004 | Etou | |
| 6,792,590 B1 | 9/2004 | Pierrat et al. | |
| 6,802,048 B2 | 10/2004 | Goto et al. | |
| 2002/0028573 A1* | 3/2002 | Kitamura et al. ........... 438/612 |
| 2002/0035720 A1* | 3/2002 | Kitamura et al. ............. 716/11 |
| 2002/0174413 A1* | 11/2002 | Tanaka ......................... 716/13 |
| 2004/0015796 A1* | 1/2004 | Frank et al. .................... 716/5 |
| 2005/0011674 A1* | 1/2005 | Oprysko et al. ............ 174/262 |
| 2005/0022149 A1* | 1/2005 | Smith et al. .................. 716/15 |
| 2007/0039171 A1* | 2/2007 | Goergen ...................... 29/825 |

OTHER PUBLICATIONS

David L Jones, PC Board Design Tutorial—Part 2, Silicon Chip, http://www.siliconchip.com.au/cms/A_30803/articles.html, Nov. 5, 2003, 8 pages.
Lee Ritchey, Anatomy of a Plated Through Hole, Speeding Edge, Aug. 30, 2001, 5 pages.
Mentor Graphics, The Power Tools for PCB Design, Board Station Suite of Tools, www.mentor.com, © 1999, 4 pages.
Pads Software, Inc. PADS-PowerBGA The Universal Window Solution for Advanced Packaging Design (document is not dated), 6 pages.
CADANCE, Datasheet, Allegro PCB Design 610, © 2004, 12 pages.

(Continued)

*Primary Examiner*—Paul Dinh
(74) *Attorney, Agent, or Firm*—Cooley Godward Kronish LLP (57) ABSTRACT

An apparatus to design a via pad of a via is described. In one embodiment, the apparatus includes a vertex determination module configured to determine a vertex of the via pad based on a position of a trace that is connected to the via. The apparatus also includes a contour definition module configured to define an extended contour of the via pad based on the vertex. The extended contour is defined such that an electrical length design characteristic of the trace is substantially unchanged by the extended contour.

5 Claims, 6 Drawing Sheets

OTHER PUBLICATIONS

CAD Design Software, BGA Manufacturing Designer Suite, © 2002, 4 pages.

Supermax Electronic Computer Aided Design, http://www.dde-eda.com/ecadman/guide/areatypes.html, date printed: Oct. 18, 2004.

CAD Design Software, Flex Designer Suite, © 2002, 4 pages.

David L. Jones, PCB Design Tutorial, www.alternatezone.com, Jun. 29, 2004, 25 pages.

* cited by examiner

*FIG. 6*

# APPARATUS, SYSTEM, AND METHOD FOR DESIGNING VIA PADS HAVING EXTENDED CONTOURS

BRIEF DESCRIPTION OF THE INVENTION

The invention relates generally to integrated circuit ("IC") packages. More particularly, the invention relates to an apparatus, system, and method for designing via pads having extended contours.

BACKGROUND OF THE INVENTION

An IC is typically placed in one or more IC packages within a packaging hierarchy to form a working electronic device. For example, an IC can be initially placed in a first level IC package such as a single-chip module ("SCM") or a multi-chip module ("MCM"), which, in turn, can be placed in a second level IC package such as a printed circuit board ("PCB"). The PCB including the IC can then be placed in a third level IC package such as a motherboard.

As the complexity of ICs has increased, the complexity of IC packages has also increased. IC packages are nowadays typically designed using computer aided design ("CAD") tools, such as one available from Cadence Design Systems, Inc. ("Cadence"). Using such a CAD tool, an IC package can be designed to include various components within one or more layers. Vias can be used to connect different layers of the IC package. Typically, a via refers to a conductive pathway that connects two or more conductive layers of an IC package.

Figure 1:
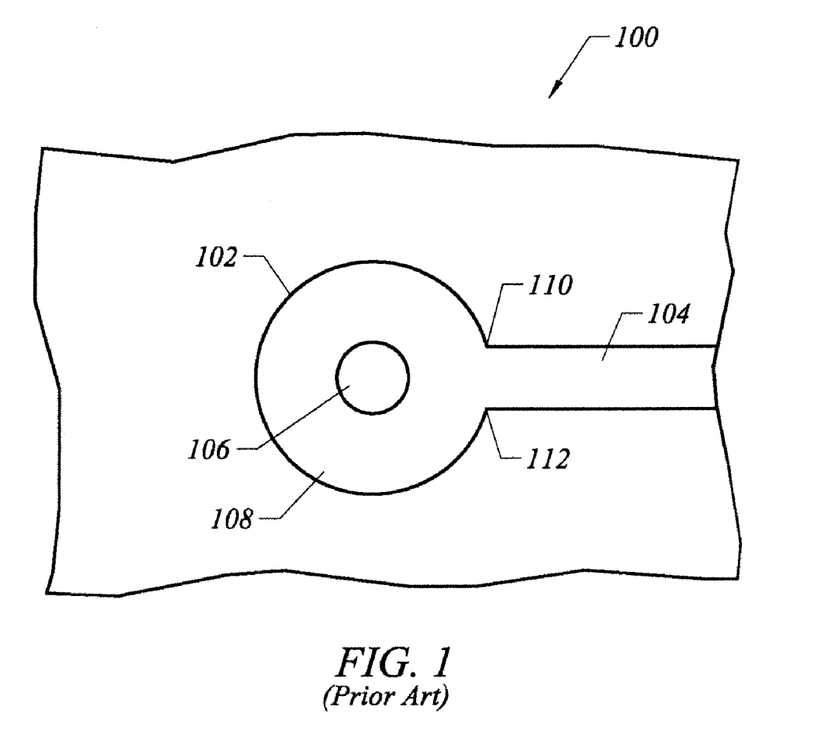
FIG. 1 illustrates a schematic of an IC package that can be designed using a CAD tool of the prior art.

FIG. 1 illustrates a schematic of an IC package 100 that can be designed using a CAD tool of the prior art. In particular, FIG. 1 illustrates a top-sectional view of a layer of the IC package 100, which includes a via 102 and a trace 104 that is connected to the via 102. The via 102 includes a channel 106, which serves as a conductive pathway that connects the trace 104 to another trace (not illustrated) within a different layer of the IC package 100. The via 102 also includes a via pad 108, which serves as a conductive structure that connects the trace 104 to the channel 106. As illustrated in FIG. 1, the via pad 108 has a generally circular outer contour that intersects the trace 104 to define junctions 110 and 112. During manufacturing and subsequent use of the IC package 100, the "sharp" transitions associated with the junctions 110 and 112 can present a number of disadvantages. In particular, the junctions 110 and 112 can serve as traps during an etching process and can have a tendency to deteriorate over time. Also, the connection between the trace 104 and the channel 106 can be prone to fail in the event of mis-alignment of the channel 106 towards either of the junctions 110 and 112. Accordingly, to provide a more robust and reliable connection between the trace 104 and the channel 106, attempts have been made to design the via pad 108 so as to "smooth out" or "taper out" the junctions 110 and 112. This process is sometimes referred to as "adding a teardrop" or "tear dropping", since the resulting via pad 108 with the added teardrop typically has an outer contour that is similar to that of a teardrop. During manufacturing, the resulting via pad 108 with the added teardrop is typically formed by including additional conductive material at or near the junctions 110 and 112.

Previous attempts for adding teardrops to a design of an IC package sometimes required a user to scan the design and manually add the teardrops at various places in the design. In light of the increased complexity of IC packages, such attempts can be tedious, time-consuming, and prone to inconsistencies or errors. While some attempts have been made to automate tear dropping for a design of an IC package, such attempts typically suffered from a notable disadvantage. In particular, such attempts typically added a teardrop to the design by defining extensions or branches of a trace to create the teardrop. However, such extensions can cause the design to misrepresent an electrical length of the trace. Typically, an electrical length of a transmission channel, such as the trace, refers to an effective length encountered by an electrical signal propagating through the transmission channel. In some instances, an electrical length of a transmission channel can be expressed as a physical length of the transmission channel multiplied by a factor that depends on a dielectric constant of the transmission channel. Extensions of the trace can be interpreted by a CAD tool as an increase in the electrical length of the trace, which increase is typically not observed in an actual IC package that is manufactured with the added teardrop. In particular, extensions of the trace can introduce errors of as much as 3 to 4 picoseconds in terms of signal propagation delays. As can be appreciated, misrepresentation of the electrical length of the trace can present a number of disadvantages, such as when using a CAD tool to verify that the design satisfies timing constraints or other design requirements. For example, misrepresentation of the electrical length of the trace can cause trace length matching computations to be erroneous. In some instances, it is desirable to perform trace length matching computations to a particular level of accuracy, such as to within 1 to 2 picoseconds in terms of signal propagation delays. Unfortunately, such level of accuracy may not be achievable in light of the errors that are introduced with the added teardrop.

It is against this background that a need arose to develop the apparatus, system, and method described herein.

SUMMARY OF THE INVENTION

In one aspect, the invention relates to an apparatus to design a via pad of a via. In one embodiment, the apparatus includes a vertex determination module configured to determine a vertex of the via pad based on a position of a trace that is connected to the via. The apparatus also includes a contour definition module configured to define an extended contour of the via pad based on the vertex. The extended contour is defined such that an electrical length design characteristic of the trace is substantially unchanged by the extended contour.

In another aspect, the invention relates to a computer-readable medium. In one embodiment, the computer-readable medium includes code to identify a via pad and a trace that is connected to the via pad. The computer-readable medium also includes code to determine a vertex of the via pad such that the vertex is positioned on the trace. The computer-readable medium further includes code to define an extension of the via pad based on the vertex. The extension of the via pad is defined without requiring an extension of the trace to be defined.

In a further aspect, the invention relates to a computer-implemented method of designing a via pad of a via. In one embodiment, the computer-implemented method includes automatically determining a vertex of the via pad based on a position of a trace that is connected to the via. The computer-implemented method also includes automatically defining a contour of the via pad based on the vertex. The contour is defined such that a design characteristic corresponding to an electrical length of the trace is substantially unchanged by the contour.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings, in which.

DETAILED DESCRIPTION

Figure 2:
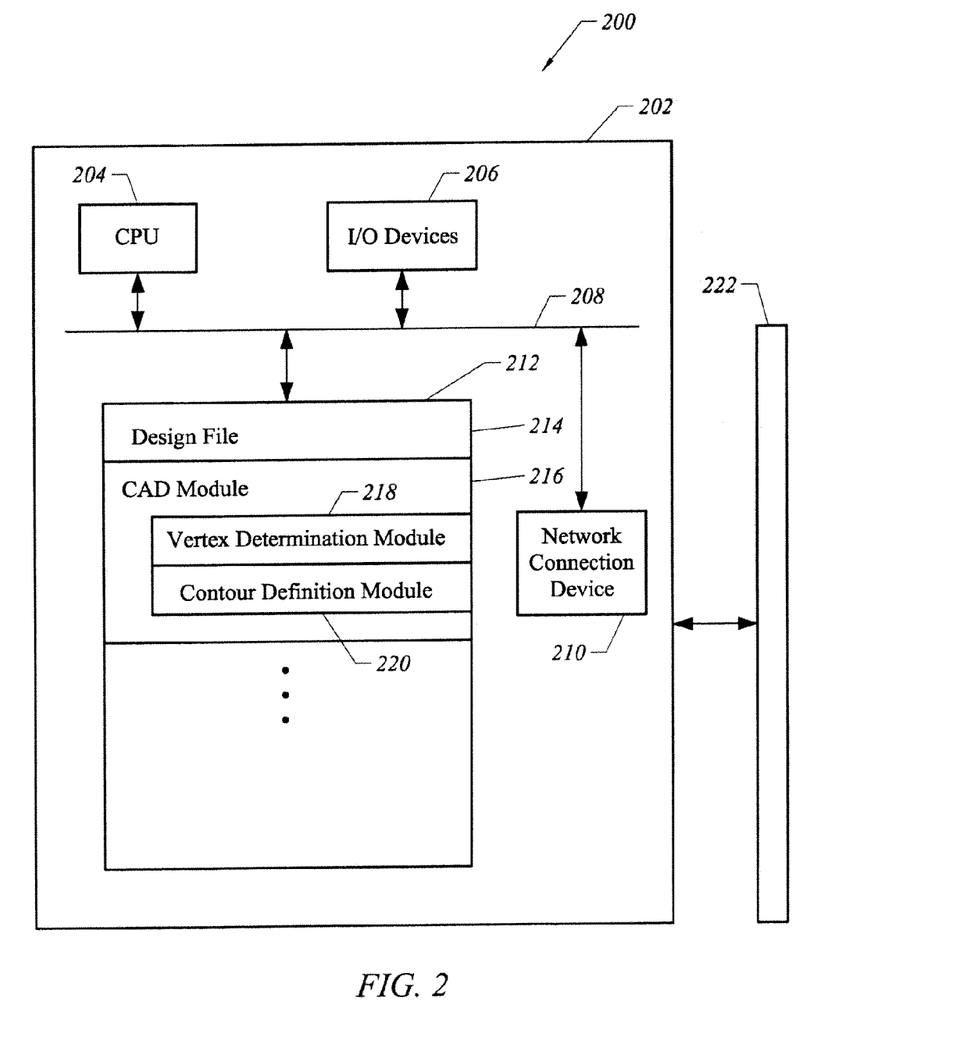
FIG. 2 illustrates a computer system that can be implemented in accordance with an embodiment of the invention.

FIG. 2 illustrates a computer system 200 that can be implemented in accordance with an embodiment of the invention. The computer system 200 includes a computer 202, which can be, for example, a server computer, a workstation, a personal computer, or a portable computing device. As illustrated in FIG. 2, the computer 202 is connected to a network 222 using any wire or wireless transmission channel.

The computer 202 includes a central processing unit ("CPU") 204 that is connected to a set of input/output devices ("I/O Devices") 206 over a bus 208. The set of I/O Devices 206 can include, for example, a keyboard, a mouse, a video monitor, and a printer. The CPU 204 is also connected to a network connection device 210 over the bus 208. The network connection device 210 is used to establish communications with the network 222.

As illustrated in FIG. 2, the CPU 204 is also connected to a memory 212 over the bus 208. The memory 212 can include, for example, a random access memory ("RAM"), a read only memory ("ROM"), or both. In the illustrated embodiment, the memory 212 stores a design file 214, which includes a design of an IC package, such as a SCM, a MCM, a PCB, or a motherboard. The design of the IC package defines the IC package in terms of a number of design characteristics. Examples of design characteristics include those corresponding to positions of one or more layers of the IC package, positions of various components of the IC package within the one or more layers, contours of the various components, electrical characteristics of the various components, mechanical characteristics of the various components, thermal characteristics of the various components, interconnections between the various components, and so forth.

As illustrated in FIG. 2, the memory 212 also stores a CAD module 216, which is used to create the design file 214. Using the CAD module 216, the IC package is designed to include the various components within the one or more layers. In the illustrated embodiment, the IC package includes multiple layers, and the CAD module 216 is used to design vias to connect different layers of the IC package. To facilitate a design of the IC package, the CAD module 216 can provide visual representations of the various components of the IC package, such as using line segments, circles, polygons, and so forth. Once the design file 214 is created, the CAD module 216 is used to verify that timing constraints or other design requirements are satisfied. For example, the CAD module 216 can process the design file 214 to perform trace length matching computations.

In the illustrated embodiment, the CAD module 216 includes a set of sub-modules that perform the operations described herein. In particular, the CAD module 216 includes a vertex determination module 218 and a contour definition module 220. As further described below, the vertex determination module 218 and the contour definition module 220 process the design file 214 to design a via pad of a via included in the IC package. In particular, the vertex determination module 218 and the contour definition module 220 are used to automatically design the via pad so as to have an extended contour, such as one that is similar to that of a teardrop.

Referring to FIG. 2, the vertex determination module 218 determines a vertex of the via pad based on a position of a trace that is connected to the via. In the illustrated embodiment, the vertex corresponds to a tip of the via pad, and the vertex determination module 218 determines the vertex such that the via pad is properly oriented with respect to the trace. Typically, the vertex is positioned on the trace such that the via pad can provide a robust and reliable connection between the trace and the via. For example, the via pad can be designed such that its extended contour is similar to that of a teardrop, and the vertex can correspond to a tip of the teardrop. In this example, the vertex determination module 218 can determine the vertex such that the tip of the teardrop is positioned on the trace.

Referring to FIG. 2, the contour definition module 220 defines the extended contour of the via pad based on the vertex. In the illustrated embodiment, the contour definition module 220 defines the extended contour so as to "smooth out" or "taper out" junctions between the via pad and the trace. For example, the via pad can be designed such that its extended contour is similar to that of a teardrop, and the extended contour can extend towards the vertex that is positioned on the trace. Once the extended contour is defined, the contour definition module 220 updates the design of the IC package included in the design file 214, such as by storing design characteristics of the extended contour in the design file 214. It is also contemplated that design characteristics of the extended contour can be stored in a separate file residing in the computer 202 or in a separate computer (not illustrated) that is connected to the network 222.

Advantageously, the contour definition module 220 defines the extended contour such that the updated design of the IC package substantially accurately represents electrical characteristics of the IC package. In the illustrated embodiment, the extended contour is defined without requiring extensions or branches of the trace to be defined. Accordingly, a design characteristic corresponding to an electrical length of the trace is substantially unchanged by the extended contour, such that the updated design of the IC package substantially accurately represents the electrical length of the trace. Typically, such substantially accurate representation of the electrical length is one that satisfies timing constraints or other design requirements. For example, the electrical length of the trace can be substantially unchanged, such that any error that is introduced falls within a desired tolerance level, such as less than about 2 or 3 picoseconds in terms of signal propagation delays. As another example, the electrical length of the trace can be substantially unchanged, such that trace length matching computations can be performed on the updated design to a desired level of accuracy, such as to within about 1 to 2 picoseconds in terms of signal propagation delays.

The vertex determination module 218 and the contour definition module 220 can automatically perform the operations described above for each of the vias included in the IC package. For example, the operations can be automatically performed for all of the vias simultaneously or sequentially. It is also contemplated that the operations can be automatically performed for a subset of the vias, which subset can be automatically selected in accordance with a particular design rule. Also, the vertex determination module 218 and the contour definition module 220 can be used to specify a number of processing options. For example, the vertex determination module 218 can be used to select a desired size of a via pad. It is also contemplated that the contour definition module 220 can be used to select a desired contour of a via pad.

The foregoing discussion provides a general overview of an embodiment of the invention. Attention next turns to FIG. 3, which illustrates a flow chart for designing a via pad in accordance with an embodiment of the invention.

Figure 3:
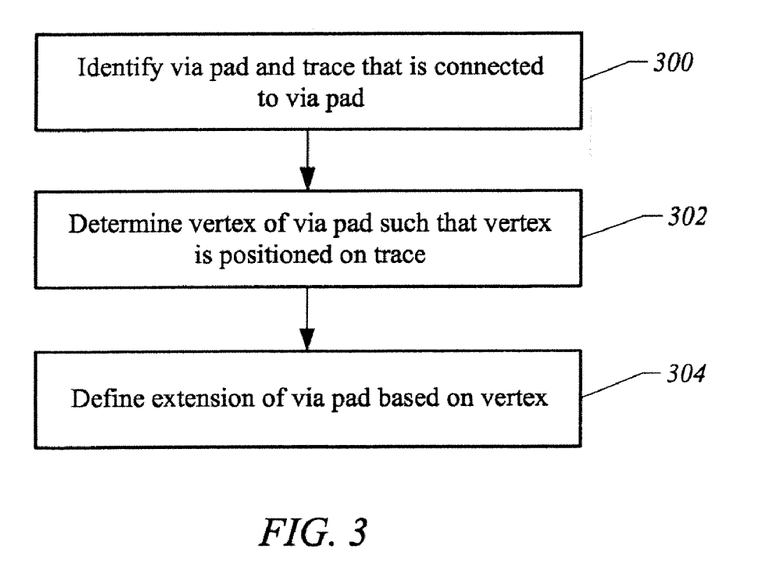
FIG. 3 illustrates a flow chart for designing a via pad in accordance with an embodiment of the invention.

The first operation illustrated in FIG. 3 is to identify the via pad and a trace that is connected to the via pad (block 300). In the illustrated embodiment, a design file for an IC package is scanned to automatically identify the via pad and the trace that are included in the IC package.

Figure 4:
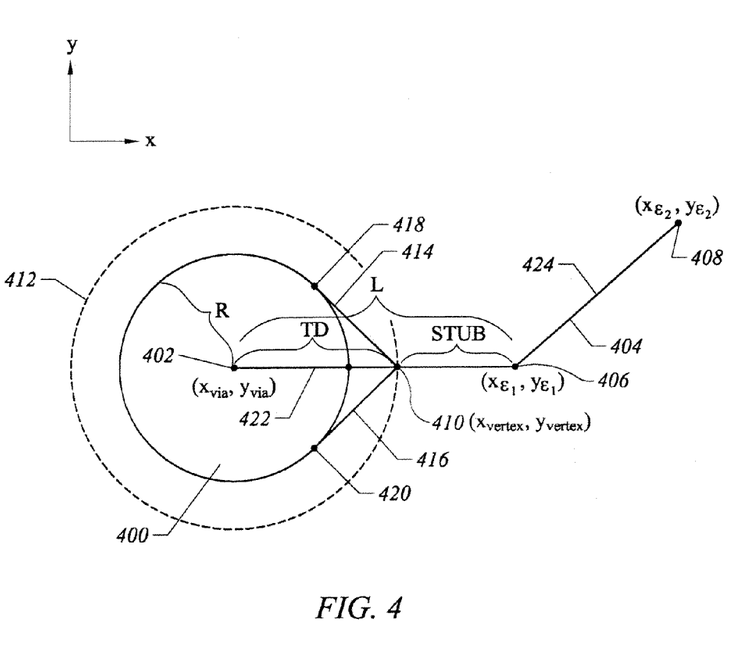
FIG. 4, FIG. 5, and FIG. 6 illustrate schematics of via pads that can be designed in accordance with an embodiment of the invention.
Figure 5:
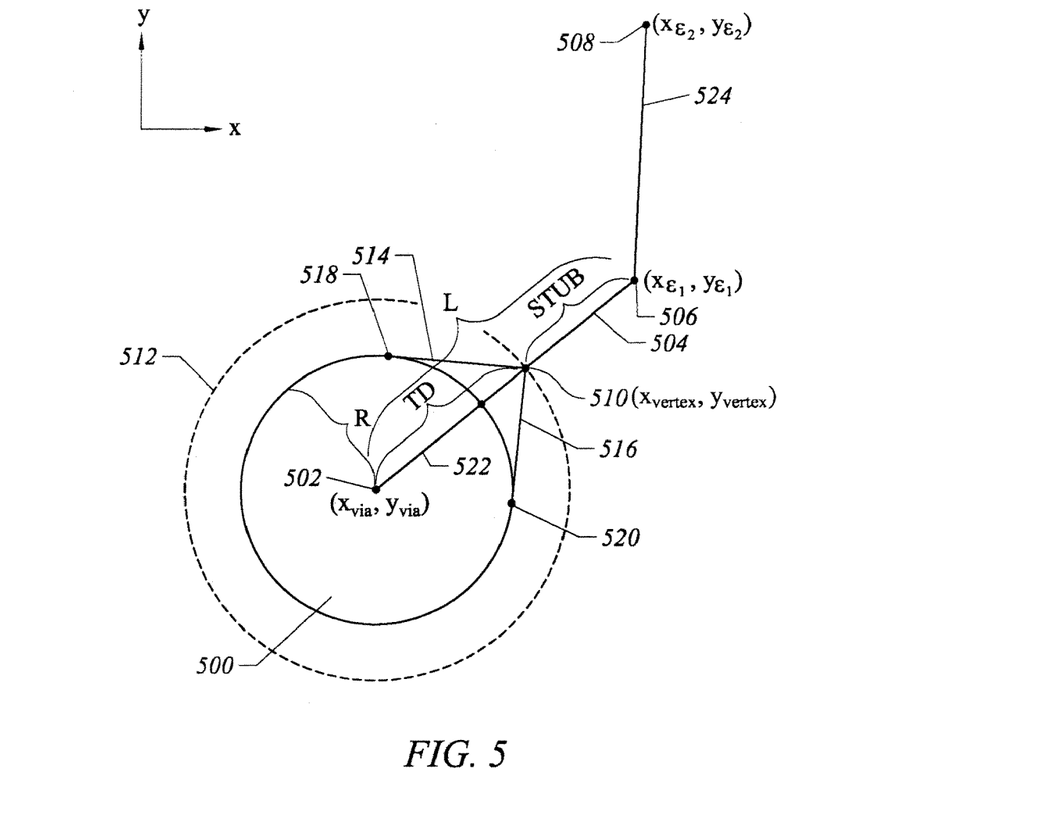
Figure 6:
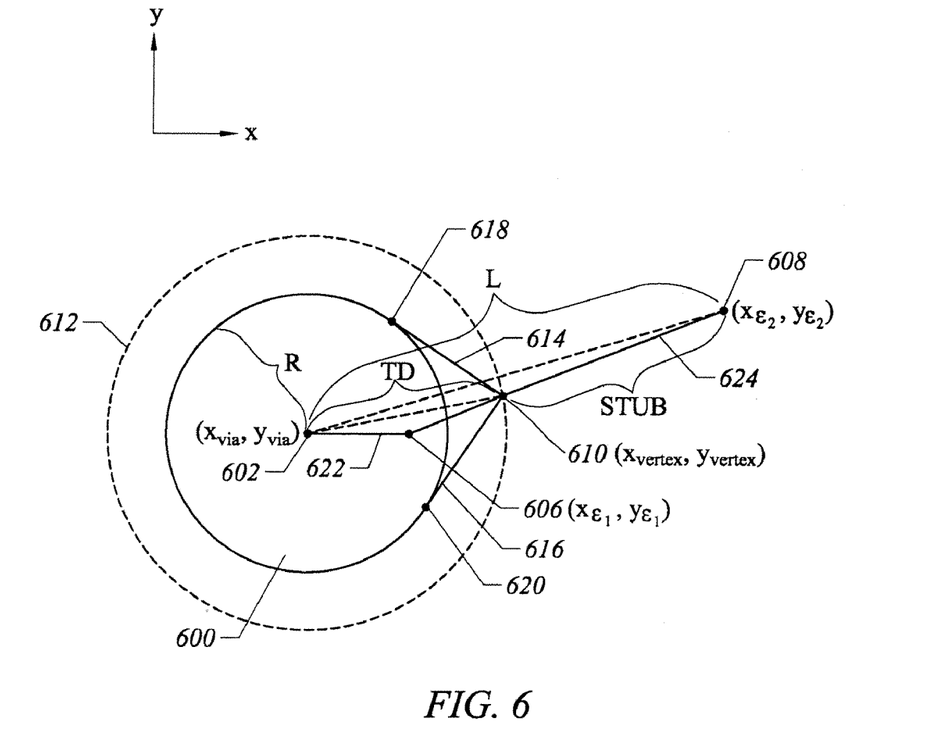

FIG. 4, FIG. 5, and FIG. 6 illustrate schematics of via pads 400, 500, and 600 that can be designed in accordance with an embodiment of the invention. Referring to FIG. 4, the via pad 400 has an initial contour that is positioned with respect to a center 402 of a via with coordinates $(x_{via}, y_{via})$. As illustrated in FIG. 4, the initial contour of the via pad 400 is generally circular and has an initial radius R, which can be set by default or can be selected by a user. The via pad 400 is connected to a trace 404, which includes end-point 406 with coordinates $(x_{E1}, y_{E1})$ and end-point 408 with coordinates $(x_{E2}, y_{E2})$. As illustrated in FIG. 4, an initial segment 422 of the trace 404 extends horizontally from the center 402 to the end-point 406, and a subsequent segment 424 of the trace 404 extends diagonally from the end-point 406 to the end-point 408. The segments 422 and 424 of the trace 404 are defined in accordance with a design rule that specifies allowed bending angles for the segments. As can be appreciated, CAD tools, such as one available from Cadence, typically specify allowed bending angles in terms of pre-defined angular increments. In the illustrated embodiment, the allowed bending angles are in predefined angular increments of 45°, namely 0°, 45°, 90°, 135°, 180°, 225°, 270°, and 315°. However, it is also contemplated that other predefined angular increments can be used to define the trace 404.

Referring to FIG. 5, the via pad 500 also has an initial contour that is generally circular and is positioned with respect to a center 502 of a via. The via pad 500 is connected to a trace 504, which includes end-points 506 and 508. Here, an initial segment 522 of the trace 504 extends diagonally from the center 502 to the end-point 506, and a subsequent segment 524 of the trace 504 extends vertically from the end-point 506 to the end-point 508.

Referring to FIG. 6, the via pad 600 also has an initial contour that is generally circular and is positioned with respect to a center 602 of a via. The via pad 600 is connected to a trace 604, which includes end-points 606 and 608. Here, an initial segment 622 of the trace 604 extends horizontally from the center 602 to the end-point 606, and a subsequent segment 624 of the trace 604 extends diagonally from the end-point 606 to the end-point 608.

The second operation illustrated in FIG. 3 is to determine a vertex of the via pad such that the vertex is positioned on the trace (block 302). In the illustrated embodiment, a position of the vertex on the trace is automatically determined based on an extended size of the via pad. The extended size of the via pad can be set by default or can be selected by a user.

Referring to FIG. 4, a vertex 410 of the via pad 400 is determined with coordinates $(x_{vertex}, y_{vertex})$ based on an extended radius TD of the via pad 400. In particular, moving away from the center 402, each successive end-point of the trace 404 is evaluated until an end-point is identified as having a radial distance L from the center 402 that is greater than the extended radius TD. Here, the end-point 406 is identified as having such a radial distance L, and a distance difference STUB between the radial distance L and the extended radius TD is determined. The vertex 410 is then determined by backtracking the distance difference STUB along the trace 404 from the end-point 406. In particular, the vertex 410 is determined to have coordinates as follows: $(x_{vertex}, y_{vertex}) = (x_{E1} - STUB, y_{E1})$. As can be appreciated with reference to FIG. 4, the vertex 410 corresponds to an intersection of the trace 404 and a circle 412 positioned with respect to the center 402 and having the extended radius TD.

Referring to FIG. 5, a vertex 510 of the via pad 500 is determined in a similar fashion. Here, the end-point 506 is identified as having a radial distance L from the center 502 that is greater than an extended radius TD, and a distance difference STUB between the radial distance L and the extended radius TD is determined. The vertex 510 is then determined by backtracking the distance difference STUB along the trace 504 from the end-point 506. In particular, the vertex 510 is determined to have coordinates as follows: $(x_{vertex}, y_{vertex}) = (x_{E1} - (STUB^2/2)^{1/2}, y_{E1} - (STUB^2/2)^{1/2})$. As can be appreciated with reference to FIG. 5, the vertex 510 corresponds to an intersection of the trace 504 and a circle 512 positioned with respect to the center 502 and having the extended radius TD.

Referring to FIG. 6, a vertex 610 of the via pad 600 is also determined in a similar fashion. Here, the end-point 608 is identified as having a radial distance L from the center 602 that is greater than an extended radius TD, and a distance difference STUB between the radial distance L and the extended radius TD is determined. The vertex 610 is then determined by backtracking the distance difference STUB along the trace 604 from the end-point 608. In particular, the vertex 610 is determined to have coordinates as follows: $(x_{vertex}, y_{vertex}) = (x_{E2} - (STUB^2/2)^{1/2}, y_{E2} - (STUB^2/2)^{1/2})$. As can be appreciated with reference to FIG. 6, the vertex 610 corresponds to an intersection of the trace 604 and a circle 612 positioned with respect to the center 602 and having a radius that is approximately the extended radius TD.

The third operation illustrated in FIG. 3 is to define an extension of the via pad based on the vertex (block 304). In the illustrated embodiment, the extension of the via pad is automatically defined without requiring an extension of the trace to be defined.

Referring to FIG. 4, an extended contour of the via pad 400 is defined by defining a pair of line segments 414 and 416 that extend towards the vertex 410. As illustrated in FIG. 4, the pair of line segments 414 and 416 extend from tangential points 418 and 420 on the initial contour of the via pad 400. In the illustrated embodiment, the pair of line segments 414 and 416 are defined such that their contribution to an electrical length design characteristic of the trace 404 is substantially zero. In particular, the pair of line segments 414 and 416 can be defined using, for example, a CAD line drawing tool and do not correspond to extensions or branches of the trace 404. While the pair of line segments 414 and 416 are illustrated as being generally straight, it is contemplated that either of, or both, the pair of line segments 414 and 416 can be curved for certain implementations.

Referring to FIG. 5, an extended contour of the via pad 500 is defined in a similar fashion. Here, a pair of line segments 514 and 516 are defined that extend between tangential points 518 and 520 and the vertex 510. As described previously, the pair of line segments 514 and 516 are defined such that their contribution to an electrical length design characteristic of the trace 504 is substantially zero.

Referring to FIG. 6, an extended contour of the via pad 600 is also defined in a similar fashion. Here, a pair of line segments 614 and 616 are defined that extend between tangential points 618 and 620 and the vertex 610. As described previously, the pair of line segments 614 and 616 are defined such that their contribution to an electrical length design characteristic of the trace 604 is substantially zero.

At this point, advantages associated with various embodiments of the invention can be appreciated. In particular, some embodiments of the invention allow teardrops to be automatically added to a design of an IC package while providing a substantially accurate representation of electrical characteristics of the IC package. In such manner, timing constraints or other design requirements can be satisfied with the added teardrops. Also, some embodiments of the invention are compatible with design rules of CAD tools, such as one available from Cadence. In particular, some embodiments of the invention allow teardrops to be automatically added to a design of an IC package, which design may define allowed bending angles of traces in terms of predefined angular increments, such as in increments of 45°.

It should be recognized that the embodiments of the invention described above are provided by way of example, and various other embodiments are encompassed by the invention. For example, while some embodiments of the invention have been described herein with reference to designing via pads, it is contemplated that other embodiments of the invention can be used to design other types of structures in ICs or IC packages so as to provide such structures with desired contours. For example, it is contemplated that an embodiment of the invention can be used to design other types of conductive structures so as to provide such conductive structures with extended contours.

Referring to FIG. 2, while the design file 214 and the CAD module 216 are illustrated as both residing in the computer 202, it is contemplated that such configuration is not required for all implementations. For example, the design file 214 can reside in a separate computer (not illustrated) that is connected to the network 222. Also, it is contemplated that either of, or both, the vertex determination module 218 and the contour definition module 220 can be provided separately from the CAD module 216 in the computer 202 or in a separate computer (not illustrated) that is connected to the network 222. In addition, while not illustrated in FIG. 2, a database management program can be provided to facilitate storage and access to the design file 214.

Referring to FIG. 4, FIG. 5, and FIG. 6, it is contemplated that the via pads 400, 500, and 600 can be connected to additional traces, and similar operations can be performed for the additional traces as described above with respect to the traces 404, 504, and 604. For example, referring to FIG. 4, the via pad 400 can be connected to an additional trace (not illustrated), and an initial segment of this additional trace can extend diagonally or vertically from the center 402.

An embodiment of the invention relates to an IC package that is designed in accordance with the operations described herein. In particular, the IC package can include a via and a trace that is connected to the via. The via can include a via pad, which can have an extended contour so as to "smooth out" or "taper out" junctions between the via pad and the trace.

An embodiment of the invention relates to a computer program product with a computer-readable medium including instructions or computer code thereon for performing various computer-implemented operations. The term "computer-readable medium" is used herein to refer to any medium that is configured to store or encode a sequence of instructions or computer code for performing the operations described herein. Computer-readable media and computer code can be those specially designed and constructed for the purposes of the invention, or can be of the kind well known and available to those having ordinary skill in the computer software arts. Examples of computer-readable media include, but are not limited to: magnetic media such as hard disks, floppy disks, and magnetic tape; optical media such as CD-ROMs and holographic devices; magneto-optical media such as floptical disks; carrier wave signals; and hardware devices that are specially configured to store and execute program code, such as application-specific integrated circuits ("ASICs"), programmable logic devices ("PLDs"), and ROM and RAM devices. Examples of computer code include machine code, such as produced by a compiler, and files containing higher level code that are executed by a computer using an interpreter. For example, an embodiment of the invention can be implemented using Java, C++, or other object-oriented programming language and development tools. Additional examples of computer code include encrypted code and compressed code.

Moreover, an embodiment of the invention can be downloaded as a computer program product, which can be transferred from a remote computer (e.g., a server computer) to a requesting computer (e.g., a client computer or a different server computer) by way of data signals embodied in a carrier wave or other propagation medium via a transmission channel. Accordingly, as used herein, a carrier wave can be regarded as a computer-readable medium.

Another embodiment of the invention can be implemented in hardwired circuitry in place of, or in combination with, computer code. With reference to FIG. 2, various components of the computer 202 can be implemented using computer code, hardwired circuitry, or a combination thereof. For example, the vertex determination module 218 and the contour definition module 220 can be implemented using hardwired circuitry, such as using ASICs or PLDs.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process operation or operations, to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations is not a limitation of the invention.

What is claimed is:

1. A computer-readable storage medium, comprising:

code to identify a via pad of a via and a trace that is connected to said via pad, said via pad having an initial contour that corresponds to a first circle positioned with respect to a center of said via, said first circle having a first radius;

code to determine a vertex of said via pad such that said vertex corresponds to an intersection of said trace and a second circle positioned with respect to said center of said via, said second circle having a second radius that is greater than said first radius;

code to define a pair of line segments that extend between respective points on said initial contour and said vertex; and code to define a modified contour of said via pad based on said pair of line segments and a first portion of said initial contour, wherein said code to define said pair of line segments includes code to define said pair of line segments such that a contribution of said pair of line segments to an electrical length design characteristic of said trace is substantially zero and wherein said first portion of said initial contour extends between said respective points on said initial contour and is positioned farther from said vertex than a second portion of said initial contour.

2. The computer-readable storage medium of claim 1, wherein said code to determine said vertex includes code to receive user-specified selection of said second radius.

3. The computer-readable storage medium of claim 1, wherein said vertex corresponds to a tip of said via pad.

4. The computer-readable storage medium of claim 1, wherein said code to define said pair of line segments includes code to define said pair of line segments such that said pair of line segments extend between respective tangential points on said initial contour and said vertex.

5. The computer-readable storage medium of claim 1, wherein said modified contour has a shape of a teardrop.

* * * * *